United States Patent [19]

Lee

[11] Patent Number: 5,747,370

[45] Date of Patent: May 5, 1998

[54] METHOD OF MANUFACTURING A NON-VOLATILE SEMICONDUCTOR DEVICE

[75] Inventor: Byung-Il Lee, Daejeon-si, Rep. of Korea

[73] Assignee: LG Semicon Co., Ltd., Chungcheongbuk-do, Rep. of Korea

[21] Appl. No.: 554,219

[22] Filed: Nov. 6, 1995

[30] Foreign Application Priority Data

Nov. 5, 1994 [KR] Rep. of Korea ............... 94-28981

[51] Int. Cl.$^6$ ............................................. H01L 21/8247
[52] U.S. Cl. .......................... 438/267; 438/593; 438/596
[58] Field of Search ........................ 437/43, 52; 438/267, 438/593, 596

[56] References Cited

U.S. PATENT DOCUMENTS

| 3,984,822 | 10/1976 | Simko et al. ............... 340/173 |
| 5,051,793 | 9/1991 | Wang . | |
| 5,070,032 | 12/1991 | Yuan et al. ............... 437/43 |
| 5,143,860 | 9/1992 | Mitchell et al. ............ 437/43 |
| 5,198,380 | 3/1993 | Harari ..................... 437/43 |
| 5,494,838 | 2/1996 | Chang et al. .............. 437/43 |

FOREIGN PATENT DOCUMENTS

| 62-125676A | 6/1987 | Japan ..................... 437/43 |
| 62-125677A | 6/1987 | Japan ..................... 437/43 |
| 63-140582A | 6/1988 | Japan ..................... 437/43 |

*Primary Examiner*—John Niebling
*Assistant Examiner*—Richard A. Booth
*Attorney, Agent, or Firm*—Loudermilk & Associates

[57] ABSTRACT

A non-volatile semiconductor memory device and manufacturing methods therefor, in which the control gate and floating gate are formed in the form of a single level or planar polysilicon layer so as to solve the problem of step coverage. The floating gate is formed in a self-aligning manner. The method may include the steps of: (a) forming a control gate upon an insulated semiconductor substrate; (b) forming an insulating layer upon the control gate; (c) depositing a polysilicon on the entire surface, etching back the polysilicon, and forming side wall floating gates on sides of the control gate; and (d) doping the substrate using the control gate and the side wall floating gates as masks so as to form source and drain regions.

5 Claims, 7 Drawing Sheets

5,747,370

1

METHOD OF MANUFACTURING A NON-VOLATILE SEMICONDUCTOR DEVICE

FIELD OF THE INVENTION

The present invention relates to non-volatile semiconductor memory devices and manufacturing methods therefor, and more particularly to devices and methods in which the process for formation of control gates and floating gates is simplified.

BACKGROUND OF THE INVENTION

In a conventional method for manufacturing a non-volatile semiconductor memory device, first, two polysilicon layers are formed, and the polysilicon layers are etched through two steps so as to form a floating gate and a control gate. Then, an ion implantation is carried out to form a source region and a drain region, thereby completing the manufacturing of the non-volatile semiconductor memory device.

The above-described conventional method for manufacturing a non-volatile semiconductor memory device will be further described referring to the drawings.

FIGS. 1A to 1C illustrate the constitution and operation of an EPROM (erasable programmable read only memory) among the various types of non-volatile semiconductor memory devices.

As illustrated in FIG. 1A, the conventional EPROM includes: control gate 11 formed upon semiconductor substrate 10; floating gate 12 formed thereunder; insulating oxide layer 14 for electrically insulating control gate 11 from floating gate 12; gate oxide layer 13 for electrically insulating floating gate 12 from semiconductor substrate 10; and source region 15 and drain region 16 formed on the left and right sides, respectively, of floating gate 12.

Operation of an EPROM constituted as described above are carried out in the following manner. First, in the case where a writing (programming) operation is carried out, a high voltage of about 12.5 volts is supplied to control gate 11, and a voltage of about 6 volts is supplied to drain region 16. The voltage which is supplied to control gate 11 induces a voltage in the floating gate, with the result that an inversion layer in a channel between source region 15 and drain region 16 is formed. Consequently, due to the voltage supplied to drain region 16, electrons 17 move from source region 15 through the channel to drain region 16.

Under this condition, due to the electric field of floating gate 12, hot electrons 18 pass through gate oxide layer 13 to intrude into floating gate 12.

FIG. 1B graphically illustrates the voltage supplied to the source-drain versus the current flowing through the source-drain.

If voltage Vds, between drain region 16 and source region 15 of FIG. 1A is increased, the current Ids between the source and drain regions increases accordingly. If the value of voltage Vds reaches above a certain value, then the value of current Ids decreases suddenly. This is due to the fact that the current flowing between the source and drain regions is introduced into floating gate 12 due to the electric field which is established by the coupling between the voltage of control gate 11 and floating gate 12. The maximum value of the current which is introduced into floating gate 12 is equivalent to n of FIG. 1B. Meanwhile, if voltage Vds is further stepped up, current Ids increases again.

In FIG. 1C, capacitor Cgf, which is connected between control gate 11 and floating gate 12 of FIG. 1A, is connected in series with capacitor Cfb, which is connected between floating gate 12 and substrate 10.

As can be seen from the equivalent circuit, the potential of floating gate 12 is determined by the two capacitors Cgf and Cfb and the voltage of control gate 11. Due to this voltage, hot electrons 18 intrude into floating gate 12.

The method for manufacturing an EPROM constituted as described above is carried out in the following manner. That is, gate oxide layer 13 is formed upon substrate 10, and a floating gate poly is deposited. Insulating layer 14 is formed again thereupon, and a control gate poly is deposited thereupon. A control gate is patterned by applying a photo etching process, and insulating layer 14 is etched. Further, the floating poly is etched so as to form control gate 11 and floating gate 12.

Accordingly, the etching precision is important to the degree that the overall characteristics of the non-volatile memory can be determined by the etching precision. However, precise patterning can be difficult. Further, control gate 11 and floating gate 12 are stacked in two layers, and, therefore, the step difference between the gate layers and other regions can be severe, with the result that it may become difficult to carry out the finishing process steps.

SUMMARY OF THE INVENTION

The present invention is intended to overcome the above-described disadvantages of the conventional technique.

Therefore, it is an object of the present invention to provide a non-volatile semiconductor memory device and a manufacturing method therefor, in which the control gate and floating gate are formed in the form of a single level or planar polysilicon layer, thereby addressing the problem of step difference, with the control gate formed by a single round of a photo etching process, and the floating gate formed in a self-aligned manner, thereby overcoming process difficulties.

In achieving the above object, the non-volatile semiconductor memory device according to the present invention includes: a control gate formed upon and insulated from a substrate; side wall floating gates formed at opposite sides of the control gate so as to make the floating gates electrically floated; and a source region and a drain region formed at opposite sides of the control gate and the side wall floating gates and in the substrate.

It may be more desirable that the source region be expanded to the edge of the control gate which is disposed upon the substrate and under the side wall floating gate.

In another aspect of the present invention, a method for manufacturing a non-volatile semiconductor memory device according to the present invention includes the steps of: (a) forming a control gate upon an insulated semiconductor substrate; (b) forming an insulating layer upon the control gate; (c) depositing a polysilicon layer on the entire surface and etching back the polysilicon layer, forming side wall floating gates on sides of the control gate; and (d) doping the substrate using the control gate and the side wall floating gates as masks, so as to form a source region and a drain region.

In still another aspect of the present invention, a method for manufacturing a non-volatile semiconductor memory device according to the present invention includes the steps of: (a) forming a control gate upon an insulated semiconductor substrate; (b) forming an insulating layer upon the control gate; (c) forming a mask for covering a portion of the control gate and a region where a drain region is to be formed, and doping the substrate so as to form a source region; (d) removing the above mask, forming a polysilicon layer on the entire surface, and carrying out an anisotropic etching so as to form a side wall floating gate on a side of the control gate; and (e) doping the substrate by using the control gate and the side wall floating gate as masks so as to form the drain region.

A thermal oxidation process preferably may be applied in forming the insulating layer of the control gate, while an ion implanting process preferably may be applied for doping the substrate.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

Figure 1A:
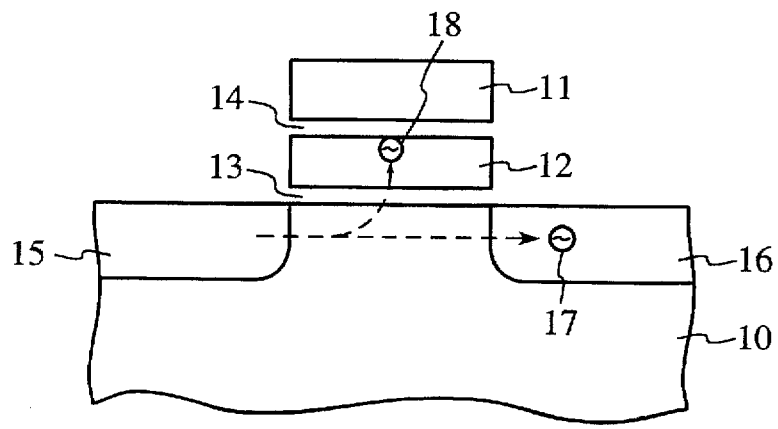
FIGS. 1A–1C illustrate the constitution and characteristics of a conventional EPROM.
Figure 1B:
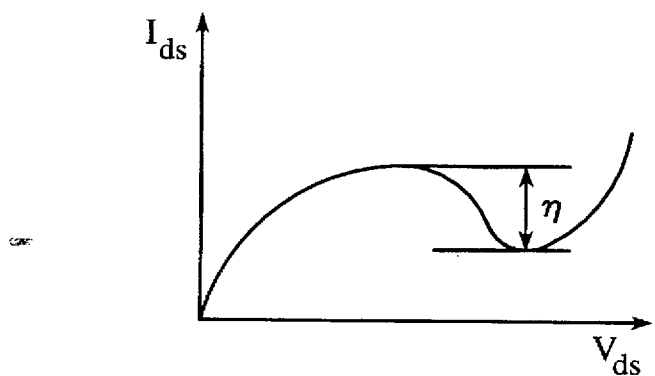
Figure 1C:
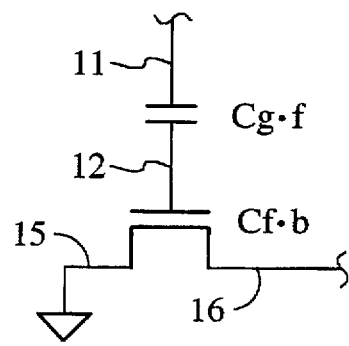
Figure 2A:
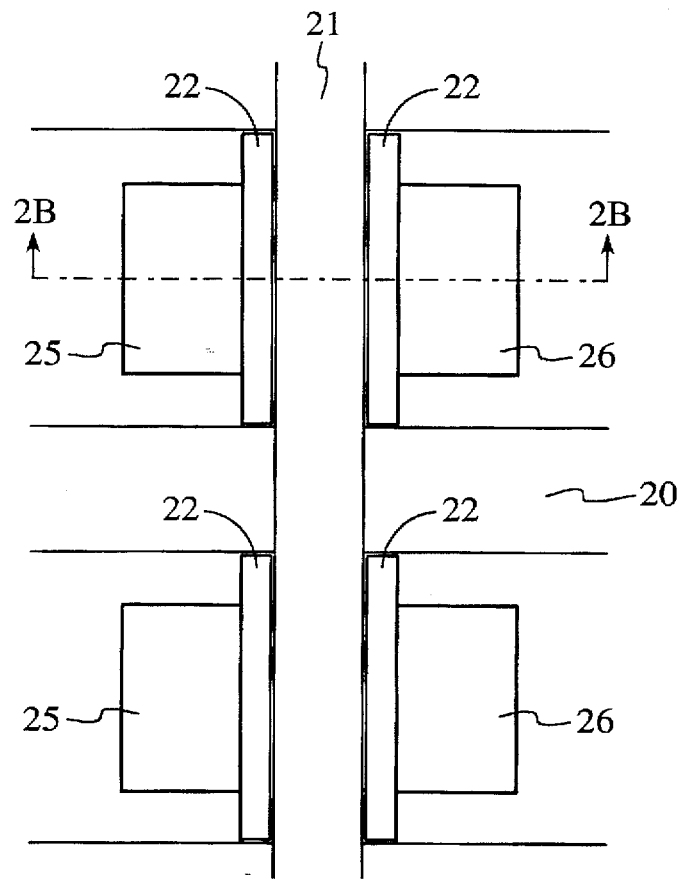
FIGS. 2A and 2B are sectional views illustrating the layout of a first embodiment of the present invention.
Figure 2B:
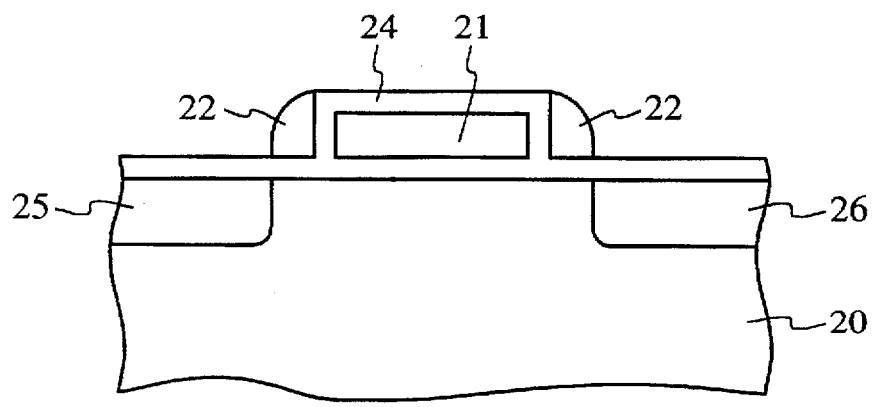

FIG. 2A illustrates the layout of a portion of a nonvolatile semiconductor memory device according to the present invention. FIG. 2B is a sectional view taken along line 2B—2B of FIG. 2A.

As illustrated in FIG. 2A, a non-volatile semiconductor memory device according to the present invention includes: control gate 21 formed upon and insulated from substrate 20; side wall floating gates 22 formed at opposite sides of control gate 21 for each cell; and source region 25 and drain region 26 formed in substrate 20 at opposite sides of side wall floating gates 22 for each cell.

As illustrated in the sectional view of FIG. 2B (taken along line 2B—2B of FIG. 2A), control gate 21 is formed insulated from substrate 20, and side wall floating gates 22 are formed at opposite sides of control gate 21 so as to be electrically floating. Further, source region 25 and drain region 26 are formed in substrate 20 at opposite sides of control gate 21 and side wall floating gates 22, so that side wall floating gates 22 would be electrically floating.

An EPROM of the present invention constituted as described above now will be described with respect to manufacturing methods suitable therefor.

FIGS. 3A–3E are sectional views illustrating a manufacturing process for an EPROM, which is a non-volatile semiconductor memory device, according to the present invention.

Figure 3A:
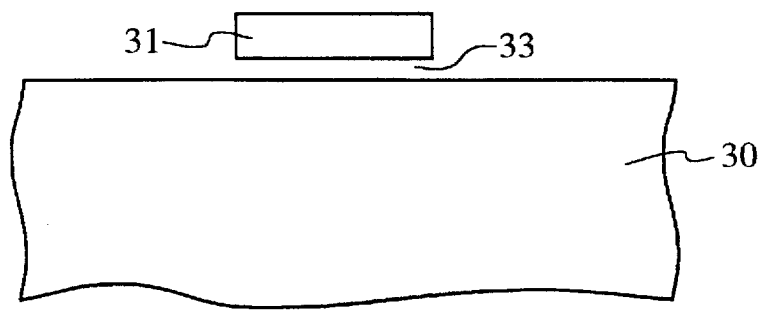
FIGS. 3A–3E illustrate a manufacturing process for the first embodiment of the present invention.

As illustrated in FIG. 3A, gate oxide layer 33 is formed upon semiconductor substrate 30, and a polysilicon layer, which is a conductive material, is deposited and patterned, thereby forming control gate 31.

Figure 3B:
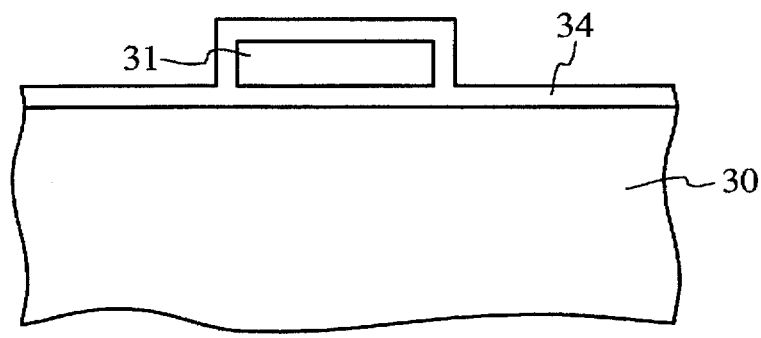

As illustrated in FIG. 3B, a thermal oxidation is carried out on the entire surface of semiconductor substrate 30 on which control gate 31 has been formed, thereby forming oxidized insulating layer 34.

Figure 3C:
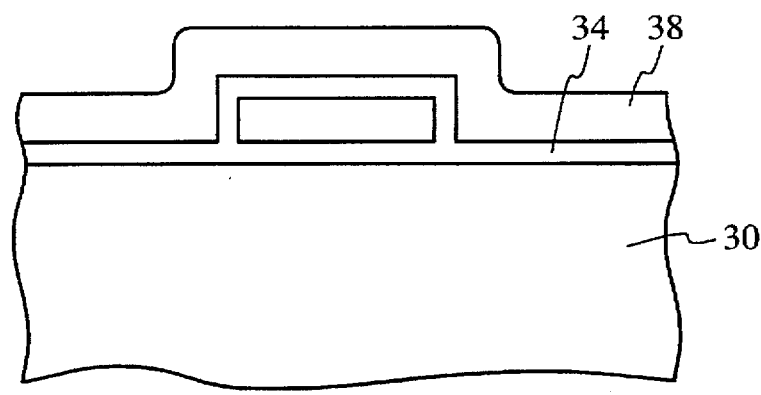

As illustrated in FIG. 3C, polysilicon layer 38 is deposited on the entire surface of semiconductor substrate 30 on which oxidized insulating layer 34 has been formed.

Figure 3D:
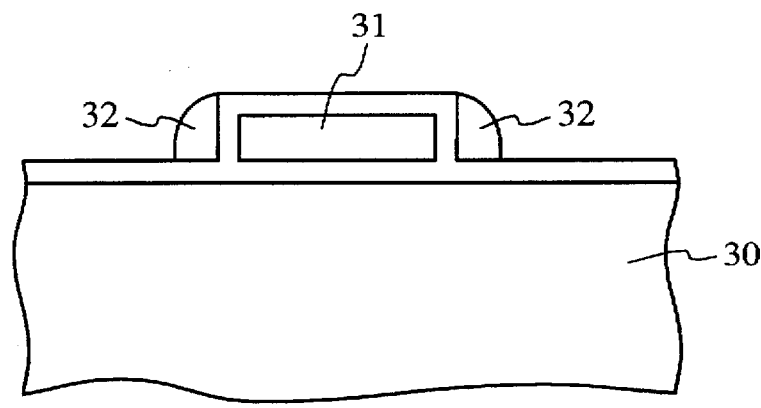

As illustrated in FIG. 3D, polysilicon layer 38, which has been deposited on the entire surface of semiconductor substrate 30, is anisotropically etched back, so that side wall floating gates 32 are formed on the opposite sides of control gate 31. Side wall floating gates 32 have the function of storing the information.

Figure 3E:
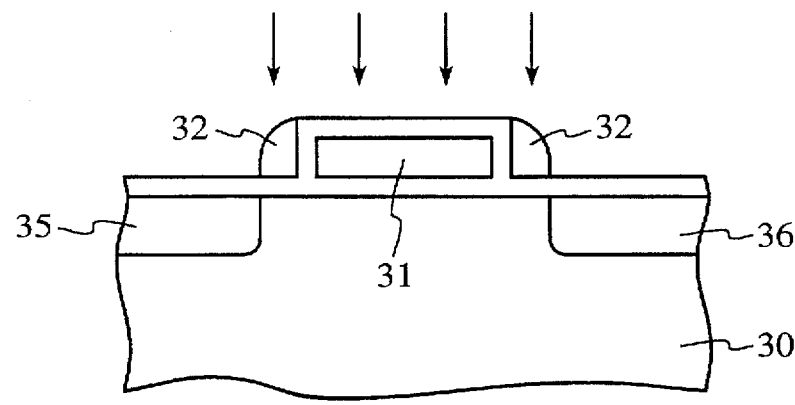

As illustrated in FIG. 3E, using control gate 31 and side wall floating gates 32 as masks, an ion implantation is carried out into the surface of semiconductor substrate 30, so as to form source region 35 and drain region 36. Under this condition, control gate 31 and side wall floating gates 32 serve as masks for the ion implantation. Thereafter, in order to form a plurality of cell arrays, the side wall floating gates are cut (etched) for each cell.

Through the above described process, an EPROM is made to have horizontally aligned control gates and side wall floating gates.

A non-volatile semiconductor memory device manufactured by the above-described process will now be described as to its operations.

Figure 4A:
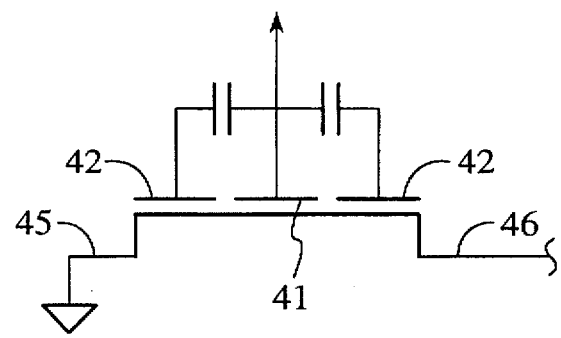
FIGS. 4A–4C illustrate operation characteristics of the first embodiment of the present invention.
Figure 4B:
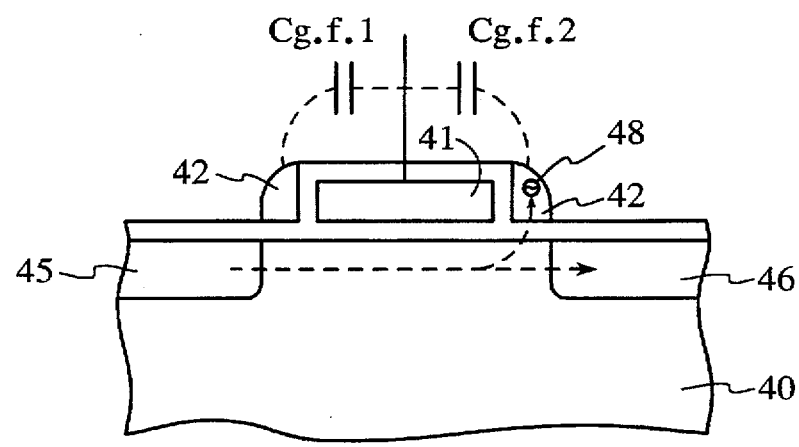
Figure 4C:
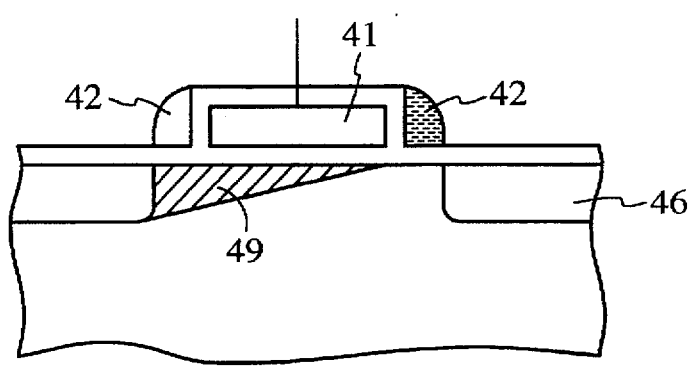

FIGS. 4A–4C illustrate the operation of an EPROM according to the present invention. FIG. 4A is an equivalent circuit for such an EPROM, FIG. 4B illustrates a writing operation of the EPROM according to the present invention, and FIG. 4C illustrates a reading operation of the EPROM according to the present invention.

When programming the EPROM, first a high voltage is supplied to control gate 41. As illustrated in FIG. 4B, the device operates as if capacitors Cgf1 and Cgf2 are connected between control gate 41 and side wall floating gates 42. Therefore, due to the effect of the two capacitors, an electric field is established in semiconductor substrate 40, which is disposed under control gate 41 and side wall floating gates 42. Consequently, an inversion layer is formed in semiconductor substrate 40 between source and drain regions 45 and 46, so as to form a channel.

Therefore, if a voltage is supplied to drain region 46, current flows through the channel of semiconductor substrate 40 and between source and drain regions 45 and 46. The hot electrons thus energized may be introduced into a side wall floating gate 42 due to the influence of the electric field of the side wall floating gate on the side of the drain.

FIG. 4C illustrates a reading operation of an EPROM according to the present invention. First, a typical reading voltage, which is other than a high voltage, is supplied to control gate 41. As illustrated in FIG. 4C, in the case where there are electrons in side wall floating gate 42 on the side of the drain (that is, in the case where the floating gate is negatively charged, that is, programmed), the electric field of control gate 41 is shielded due to the electrons of side wall floating gate 42 on the side of the drain, with the result that the channel portion thereof is not affected. That is, an inversion layer is not formed in the substrate under the side wall floating gate on the side of the drain. Therefore, channel 49 is not formed under the side wall floating gate on the side of the drain, and, therefore, even if a voltage is supplied between source and drain regions 45 and 46, no current flows between the source and drain regions.

Meanwhile, in the case where electrons are not stored in the side wall floating gate of the side of the drain, an electric field is established in the substrate under the side wall floating gate due to the coupling between the control gate and the side wall floating gate. Therefore, an inversion layer is formed under the side wall floating gate on the side of the drain, with the result that a channel is formed. If a voltage is supplied to the side of the drain, then electric current flows through the channel and between the source and drain.

Thus in accordance with whether the side wall floating gate on the side of the drain is charged with electrons, the programmed state of the EPROM appears in the form of a "0" or a "1".

Now a second embodiment of a non-volatile semiconductor memory device will be described. In this second embodiment, the source region is expanded under the side wall floating gate, thereby improving the characteristics of reading and writing operations.

Figure 5A:
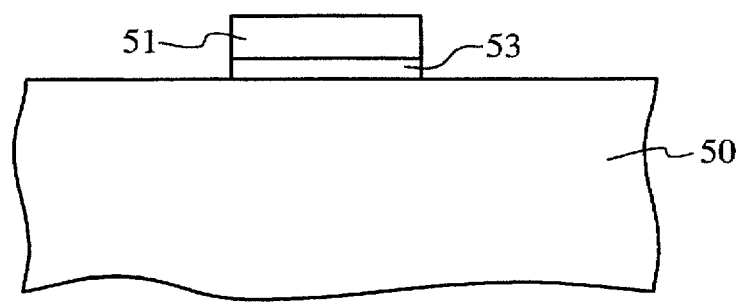
FIGS. 5A–5F illustrate a manufacturing process for a second embodiment of the present invention.

As illustrated in FIG. 5A, control gate 51 is formed upon semiconductor substrate 50, and control gate 51 is insulated from substrate 50 by means of gate oxide layer 53.

Figure 5B:
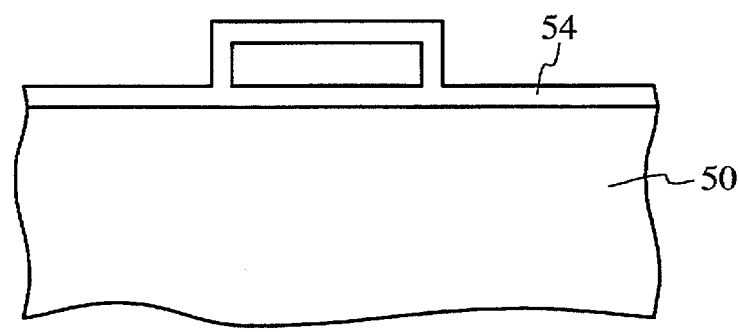

As illustrated in FIG. 5B, the entire surface of semiconductor substrate 50 is subjected to a thermal oxidation so as to form oxidized insulating layer 54 on control gate 51 and substrate 50.

Figure 5C:
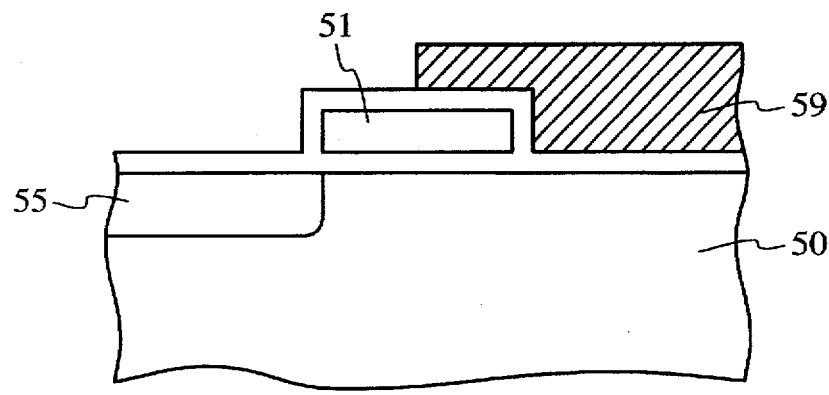

As illustrated in FIG. 5C, photoresist mask 59 is formed on a portion of the control gate adjacent to a region where a drain region is to be formed and upon the region where a drain region is be formed. An n-type impurity is ion-implanted into the entire surface of semiconductor substrate 50 using photoresist mask 59 and control gate 51 as a mask. Under this condition, a high concentration doping is carried out on a region in which a source is to be formed, thereby forming source region 55.

Figure 5D:
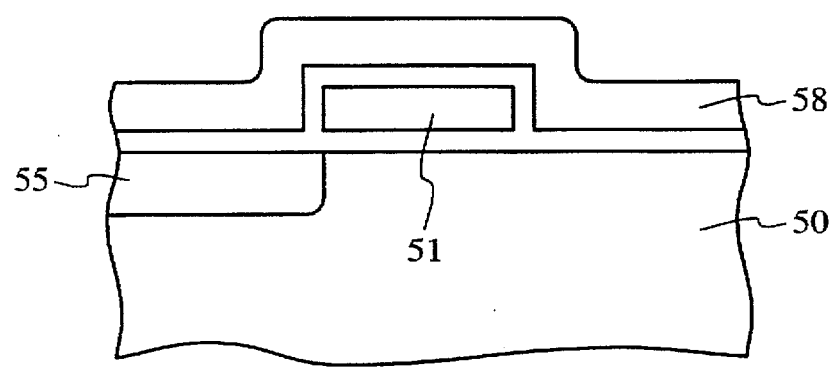
Figure 5E:
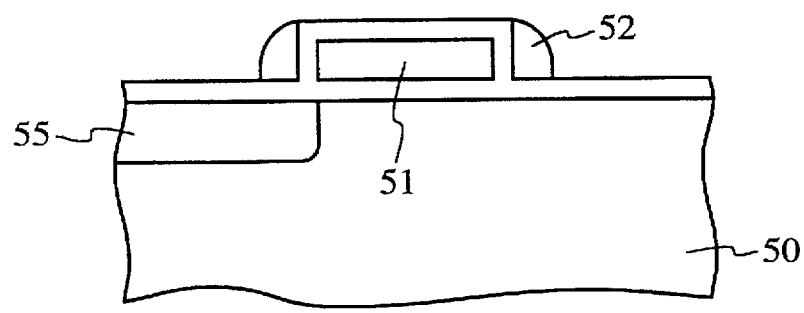
Figure 5F:
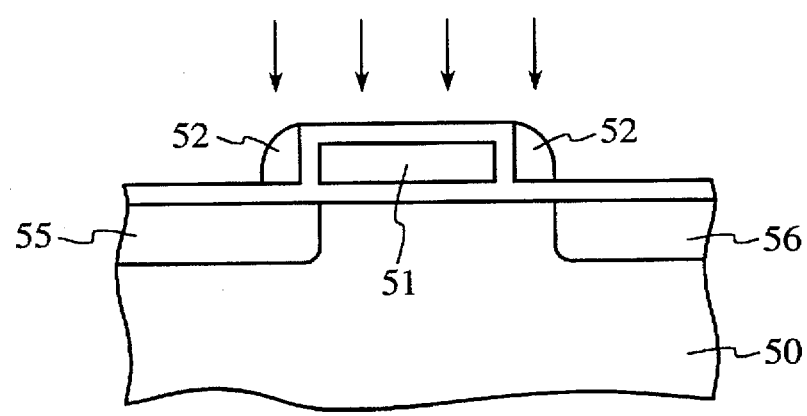

As illustrated in FIG. 5D, the photoresist mask is removed, and polysilicon layer 58 as a conductive layer is formed on the resulting surface of semiconductor substrate 50. As illustrated in FIG. 5E, polysilicon layer 58 is anisotropically etched so as to form side wall floating gate 52 on opposite sides of control gate 51. As illustrated in FIG. 5F, an ion implantation is carried out on the entire surface of semiconductor substrate 50 using side wall floating gates 52 and control gate 51 as a mask, thereby forming drain region 56. In order to form a plurality of cell arrays, an etching process is carried out to cut the floating gate for each cell.

In this EPROM in which the source region is expanded, the source region is intensely doped prior to forming the side wall floating gates, so that the source region would be expanded under the side wall floating gate on the side of the source. In this structure, the beginning portion of the channel lies just under the edge of the control gate, and, therefore, the length of the channel is shorter than that of the first embodiment. Consequently, the speed may be improved, and the operating voltage may become lower.

Figure 6A:
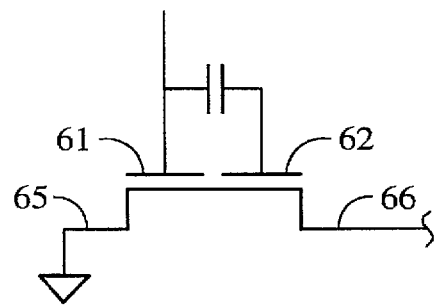
FIGS. 6A–6C illustrate operation characteristics of the second embodiment of the present invention.
Figure 6B:
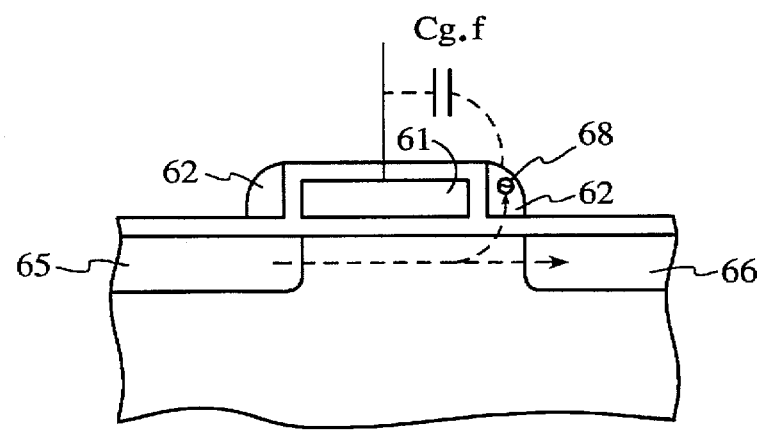
Figure 6C:
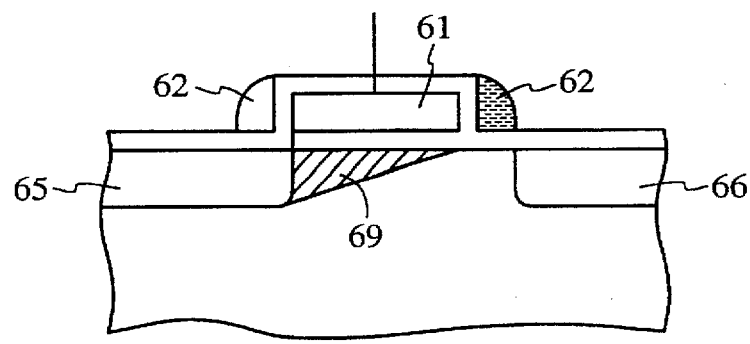

FIGS. 6A–6C illustrate an equivalent circuit of an EPROM in which the source region is expanded, and also illustrates the operating characteristics of such an EPROM. FIG. 6A is an equivalent circuit of an EPROM in which the source region is expanded, FIG. 6B illustrates a writing operation, and FIG. 6C illustrates an operation in a programmed state.

As illustrated in FIG. 6A, the equivalent circuit of the EPROM is like that in which capacitor Cgf is connected between control gate 61 and side wall floating gate 62 on the side of the drain.

When programming the EPROM, a high voltage is supplied to control gate 61, and the voltage which has been supplied to control gate 61 is coupled to side wall floating gate 62 on the side of the drain. An electric field also is established in the semiconductor substrate, so that an inversion layer would be formed between source region 65 and drain region 66, thereby forming a channel. Then, if a voltage is supplied between the source and the drain, electric current flows through the channel in the semiconductor substrate and between the source and the drain regions. This current includes hot electrons 68 having a high energy due to the high electric field, so as to be introduced into side wall floating gate 62 across the insulating layer. Accordingly, charges are stored in the floating gate, so that programming may be accomplished.

The reading operation from a programmed EPROM is carried out in the following manner. That is, as illustrated in FIG. 6C, a voltage lower than the programming voltage is supplied to control gate 61, and an operating voltage is supplied between the source and drain regions. Since negative charges have been stored in side wall floating gate 62 on the side of the drain, the voltage which is supplied to control gate 61 does not affect the channel region which lies under the side wall floating gate, and, therefore, an inversion layer does not form in the substrate under the side wall floating gate on the side of the drain. Consequently, channel 69 is not formed sufficiently to allow the flow of electric current between the source and drain regions. Therefore, even if a voltage is supplied between source region 65 and drain region 66, electric current does not flow between the source and drain regions.

Meanwhile, in the case where there are no electrons in the side wall floating gate, that is, in the case where a voltage is not supplied to the control gate or between the source and drain regions during programming, the voltage of the control gate is induced in the side wall floating gate due to capacitor Cgf, which is connected between control gate 61 and side wall floating gate 62 on the side of the drain. Consequently, an electric field is induced in the substrate. Accordingly, an inversion layer may be formed under the side wall floating gate on the side of the drain, with the result that a channel may be formed. Therefore, if a voltage is supplied between the source and drain regions, then electric current may flow through the channel and between the source and drain regions.

Thus, in accordance with whether charges are accumulated in the side wall floating gate on the side of the drain, the operating state of the EPROM can be programmed into a "0" or a "1".

According to the present invention as described above, the control gate and the floating gate are formed in a side-gate type, single level manner, and, therefore, the manufacturing process may become easier, unlike conventional non-volatile semiconductor memory devices.

Further, a single level or planar-type polysilicon layer is formed to form the control gate and the floating gate. Therefore, the step difference is not as large, and, therefore, subsequent process steps may be more easily carried out.

Particularly, in the case of the second embodiment of the non-volatile semiconductor memory device of the present invention, in which the source region is expanded, the beginning of the channel portion becomes the end of the control gate, and, therefore, the channel length becomes shorter, with the result that the resistance of the channel on the side of the source can be reduced. Therefore, when carrying out a writing operation, a large amount of hot electrons can be induced on the side of the drain. Further, when carrying out a reading operation, the resistance on the side of the source may be reduced, so that the reading operation may be improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for manufacturing a non-volatile semiconductor memory device, comprising the steps of:
   (a) forming a control gate on an insulated semiconductor substrate;
   (b) forming an insulating layer on the control gate;
   (c) forming a mask over a portion of the control gate adjacent to a region where a drain region is to be formed and over the region where the drain region is to formed, and doping the substrate so as to form a source region;
   (d) removing the mask, forming a polysilicon layer on the entire exposed surface, and carrying out an anisotropic etching so as to form a side wall floating gate on at least the side of the control gate adjacent to the region where the drain region is to be formed; and
   (e) doping the substrate using the control gate and the side wall floating gate as a mask, wherein the drain region is formed in the substrate.

2. The method of claim 1, wherein, at step (b), the control gate is subjected to a thermal oxidation to form the insulating layer.

3. The method of claim 1, wherein, at step (c), the side wall floating gate is cut so as to form a plurality of cells.

4. The method of claim 1, wherein, at step (c), an impurity is ion-implanted into the substrate.

5. The method of claim 1, wherein, at step (e), an impurity is ion-implanted into the substrate.

* * * * *